US012125555B2

United States Patent
Fantini et al.

(10) Patent No.: US 12,125,555 B2
(45) Date of Patent: Oct. 22, 2024

(54) MATRIX FORMATION FOR PERFORMING COMPUTATIONAL OPERATIONS IN MEMORY

(71) Applicant: Micron Technology, Inc., Boise, ID (US)

(72) Inventors: Paolo Fantini, Vimercate (IT); Maurizio Rizzi, Cologno Monzese (IT)

(73) Assignee: Micron Technology, Inc., Boise, ID (US)

(*) Notice: Subject to any disclaimer, the term of this patent is extended or adjusted under 35 U.S.C. 154(b) by 88 days.

(21) Appl. No.: 17/944,390

(22) Filed: Sep. 14, 2022

(65) Prior Publication Data

US 2024/0087619 A1    Mar. 14, 2024

(51) Int. Cl.
*G06F 17/16* (2006.01)
*G11C 7/10* (2006.01)

(52) U.S. Cl.
CPC ............ *G11C 7/1069* (2013.01); *G06F 17/16* (2013.01); *G11C 7/1063* (2013.01)

(58) Field of Classification Search
CPC ...... G11C 7/1069; G11C 7/1063; G06F 17/16
USPC .................................................... 365/189.11
See application file for complete search history.

(56) References Cited

U.S. PATENT DOCUMENTS

| 10,714,185 B2 | 7/2020 | Sforzin et al. |
| 11,177,009 B2 | 11/2021 | Hirst et al. |
| 11,244,739 B2 | 2/2022 | Vincenzo et al. |
| 11,315,633 B2 | 4/2022 | Castro et al. |

FOREIGN PATENT DOCUMENTS

WO    2021176244 A1    9/2021

OTHER PUBLICATIONS

U.S. Appl. No. 17/044,150, entitled, "Counter-Based Methods and Systems for Accessing Memory Cells" filed May 13, 2020, 49 pages.
Gokmen, et al., "Acceleration of Deep Neural Network Training with Resistive Cross-Point Devices: Design Considerations", Frontiers in Neuroscience, vol. 10, Jul. 2016, pp. 1-13.

*Primary Examiner* — Ly D Pham
(74) *Attorney, Agent, or Firm* — Brooks, Cameron & Huebsch, PLLC (57) ABSTRACT

Apparatuses, methods, and systems for matrix formation for performing computational operations in memory are included. An embodiment includes a memory having a plurality of levels, wherein each of the plurality of levels includes a plurality of memory cells, voltage circuitry configured to apply sub-threshold voltages to the memory cells of each respective level, a plurality of sense lines, sense circuitry coupled to the plurality of sense lines, wherein the sense circuitry coupled to each respective sense line is configured to sense a state for each of the number of memory cells coupled to that respective sense line responsive to the voltage circuitry applying the sub-threshold voltages to the memory cells of each respective level, and processing circuitry configured to utilize the states for each of the memory cells to form a matrix and perform computational operations on data stored in the memory using the matrix.

20 Claims, 6 Drawing Sheets

MATRIX FORMATION FOR PERFORMING COMPUTATIONAL OPERATIONS IN MEMORY

TECHNICAL FIELD

The present disclosure relates generally to semiconductor memory and methods, and more particularly, to matrix formation for performing computational operations in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in various architectures, such as a vertical pillar architecture with memory cells (e.g., resistance variable cells) arranged in word line layers, or a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

The present disclosure includes apparatuses, methods, and systems for matrix formation for performing computational operations in memory. An example apparatus includes a memory having a plurality of levels, wherein each of the plurality of levels includes a plurality of memory cells, voltage circuitry configured to apply sub-threshold voltages to the memory cells of each respective level, a plurality of sense lines, wherein each of the plurality sense lines is coupled to a number of the memory cells of each respective level, sense circuitry coupled to the plurality of sense lines, wherein the sense circuitry coupled to each respective sense line is configured to sense a state for each of the number of memory cells coupled to that respective sense line responsive to the voltage circuitry applying the sub-threshold voltages to the memory cells of each respective level, and processing circuitry configured to utilize the states for each of the memory cells to form a matrix and perform computational operations on data stored in the memory using the matrix.

Previous computing systems may utilize a von Neumann architecture to perform computational operations on data stored in the memory. In a von Neumann architecture, memory cells and processing/computational units are distinct (e.g., physically separated from one another); in other words, for computational operations data is transferred from the memory to external processing circuitry. Because of this physical separation, to perform operations (e.g., processing and/or computational operations), data is transferred back and forth between the memory cells and the processing/computational units (e.g., circuitry). To perform these transfers, power and system resources are required. In some instances, the energy consumed transferring the data back and forth between the memory cells and the processing and/or computational units can even outweigh the energy consumed for the processing/computational operations. Further, the data transfer can increase the amount of time used to perform the processing and/or computational operations.

Embodiments of the present disclosure, however, provide improvements in power consumption and/or system resource utilization by not transferring data to external processing circuitry. For example, one or more embodiments of the present disclosure provide that circuitry utilized for matrix formation for use in performing computational operations, as discussed further herein, can be located on a same chip as the memory cells that store the data on which the computational operations are performed. As such, the data does not need to be transferred to external processing circuitry for the computational operations. Because the circuitry and the memory cells utilized to form a matrix are physically nearer one another (e.g., integrated on the same chip) power consumption and/or system resource utilization are improved.

Also, computational operations, such as matrix-vector operations (e.g., matrix-vector multiplication) in accordance with the present disclosure can be utilized for a number of computing applications, including in-memory computing and/or deep neural network applications. One or more embodiments of the present disclosure provide that the memory cells are comprised in a plurality of levels such that sensed states for the memory cells can be utilized to form a matrix, which can be utilized for computational operations, such as matrix-vector operations. As mentioned, because the circuitry and the memory cells utilized to form a matrix are physically nearer one another (integrated on the same chip) power consumption and/or system resource utilization are improved.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
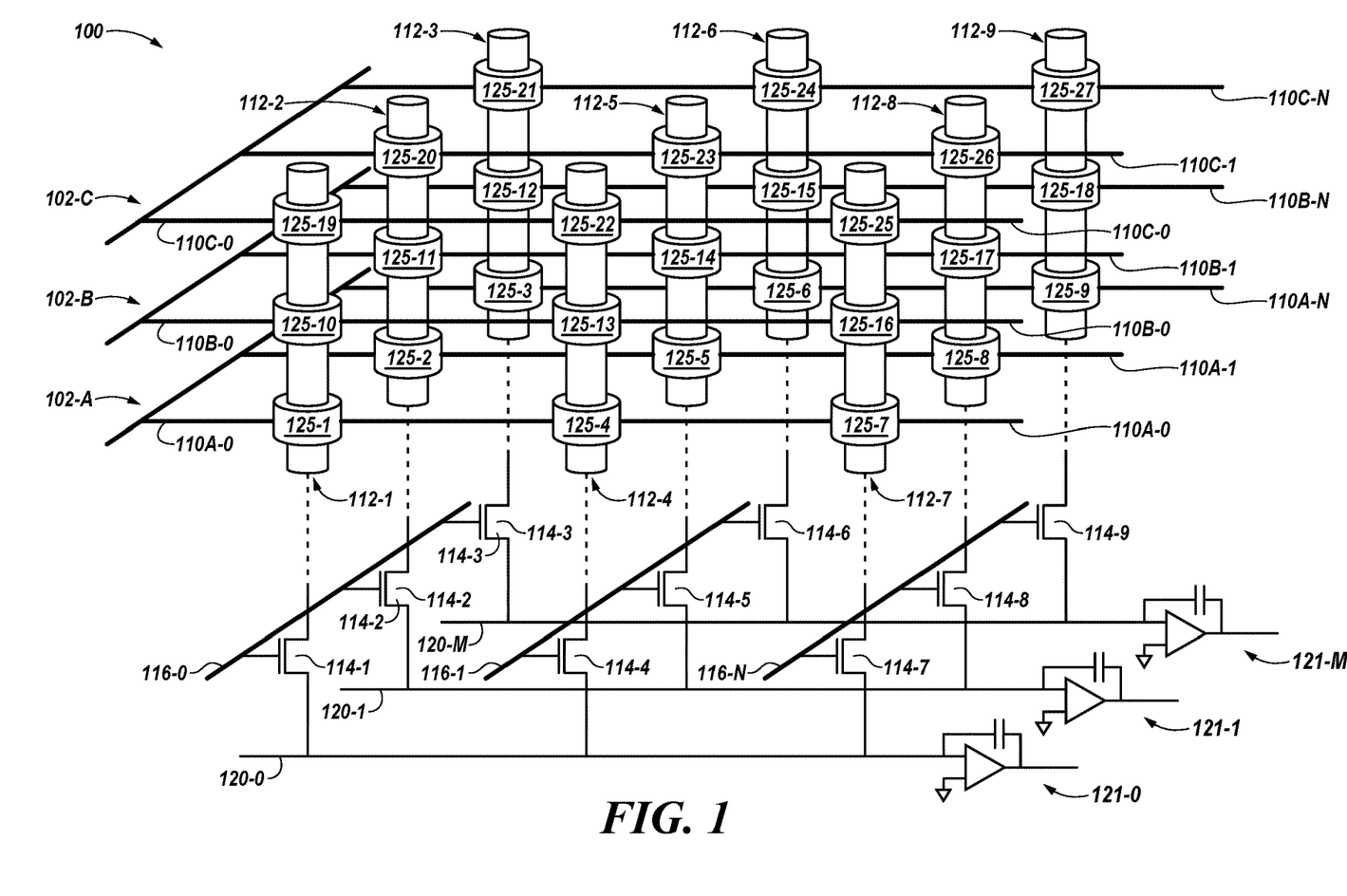
FIG. 1 is a three-dimensional view of a portion of an example of a memory array, in accordance with an embodiment of the present disclosure.

FIG. 1 is a three-dimensional view of a portion of an example of a memory array 100 (e.g., a three-dimensional vertical pillar memory array), in accordance with an embodiment of the present disclosure. Memory array 100 may include a plurality of first signal lines (e.g., first access lines), which may be referred to as word lines 110A-0, 110A-1 to 110A-N, 110B-0, 110B-1 to 110B-N, 110C-0, 110C-1 to 110C-N and a plurality of second signal lines (e.g., second access lines), which may be referred to as sense (e.g., digit or bit) lines 120-0, 120-1 to 120-M.

FIG. 1 shows a plurality of planes 102A, 102B, 102C (e.g., layers or levels). While three planes are shown in FIG. 1, embodiments are not so limited, and may include more than three planes. As shown in FIG. 1, the planes 102A, 102B, 102C are separated in a z-direction (e.g., separated vertically) from one another. FIG. 1 further illustrates an x-direction (e.g., a first horizontal direction) and a y-direction (e.g., a second horizontal direction). While not shown in FIG. 1, for clarity and so as not to obscure embodiments of the present disclosure, components of the memory array 100, as well as different layers of the memory array 100 may be separated by an insulation material (e.g., a dielectric material).

The memory array 100 may include a number of conductive pillars 112-1, 112-2, 112-3, 112-4, 112-5, 112-6, 112-7, 112-8, 112-9. The conductive pillars 112-1, 112-2, 112-3, 112-4, 112-5, 112-6, 112-7, 112-8, 112-9 can comprise a metallic (or semi-metallic) material or a semiconductor material such as a doped polysilicon material, among others. Various types of conductive pillars may be utilized. For instance, the conductive pillars 112-1, 112-2, 112-3, 112-4, 112-5, 112-6, 112-7, 112-8, 112-9 may be tubular, or have other shapes. The conductive pillars 112-1, 112-2, 112-3, 112-4, 112-5, 112-6, 112-7, 112-8, 112-9 may have a hollow center or a solid center, for example.

As shown in FIG. 1, each of the conductive pillars 112-1, 112-2, 112-3, 112-4, 112-5, 112-6, 112-7, 112-8, 112-9 may be respectively coupled to a sense line 120-0, 120-1 to 120-M via a select element 114-1, 114-2, 114-3, 114-4, 114-5, 114-6, 114-7, 114-8, 114-9 (e.g., switch). An example of the select element is a thin-film transistor (tft); however, embodiments are not so limited. The select element 114-1, 114-2, 114-3, 114-4, 114-5, 114-6, 114-7, 114-8, 114-9 can be driven by a gate line 116-0, 116-1 to 116-N, for example. Activating (e.g., biasing) a select element coupled to a particular conductive pillar may provide that an operation (e.g., a sense operation or a programming operation) may be performed on one or more memory cells coupled to the particular conductive pillar.

As shown in FIG. 1, the memory array 100 includes a number of memory cells 125-1 to 125-27. Each of the memory cells 125-1 to 125-27 can be coupled to one of the first signal lines 110. For instance, as shown in FIG. 1, memory cells 125-1, 125-4, and 125-7 are coupled to first signal line 110A-0, while memory cells 125-11, 125-14, and 125-17 are coupled to first signal line 110B-1. Each of the memory cells 125-1 to 125-27 can be coupled to one of the conductive pillars 112. For instance, as shown in FIG. 1, memory cells 125-1, 125-10, and 125-19 are coupled to conductive pillar 112-1, while memory cells 125-4, 125-13, and 125-22 are coupled to conductive pillar 112-4. Each of the memory cells 125-1 to 125-27 can be coupled to one of the second signal lines 120. For instance, as shown in FIG. 1, memory cells 125-1, 125-10, 125-19, 125-4, 128-13, 125-22, 125-7, 125-16, and 125-25 are coupled to second signal line 120-0, while memory cells 125-3, 125-12, 125-21, 126-6, 125-15, 125-24, 125-9, 125-18, and 125-27 are coupled to second signal line 120-M.

The memory cells 125 may be programmable to one of two different data states (e.g., the memory cells are binary), as will be further described further herein. Further, a group of the memory cells 125 can comprise a codeword, which can refer to a logical unit of a memory device used to store data.

The memory cells 125 may be resistance variable memory cells, for example. The memory cells 125 may include a material programmable to different data states (e.g., a set state or a reset state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials (e.g., chalcogenide storage materials) may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example. In contrast to a threshold voltage, a "sub-threshold voltage" is a voltage that would not cause a switching event to occur in the cell (e.g., a sub-threshold voltage that is less than the threshold voltage).

The architecture of memory array 100 may be referred to as a three-dimensional vertical pillar architecture having a plurality of vertically oriented (e.g., vertical) conductive pillars and a plurality of horizontally oriented (e.g., horizontal) access lines, as illustrated in FIG. 1. One or more embodiments provide that circuitry 121-0, 121-1, 121-M can be located (e.g., coupled to sense lines 120-0, 120-1, 120-M, respectively) on the same chip as the array 100 (e.g. the circuitry can be located under the array). As an example, the circuitry 121-0, 121-1, 121-M can be located in an under array area (e.g., a CMOS under array area) of the three-dimensional vertical pillar architecture. For instance, one or more embodiments provide that word line decoders can be fitted below staircases to provide a location space for circuitry 121-0, 121-1, 121-M under the array 100.

The circuitry 121-0, 121-1, 121-M can be configured to perform a number of operations discussed herein. For instance, circuitry 121-0, 121-1, 121-M can be configured to perform computational operations, and/or form a matrix for use in performing computational operations, as discussed further herein. Circuity 121-0, 121-1, 121-M can include a number of various components. For instance, as shown in FIG. 1, circuitry 121-0, 121-1, 121-M can include a capacitor and a comparator; however, embodiments are not so limited and fewer or additional various components may be utilized.

Figure 2A:
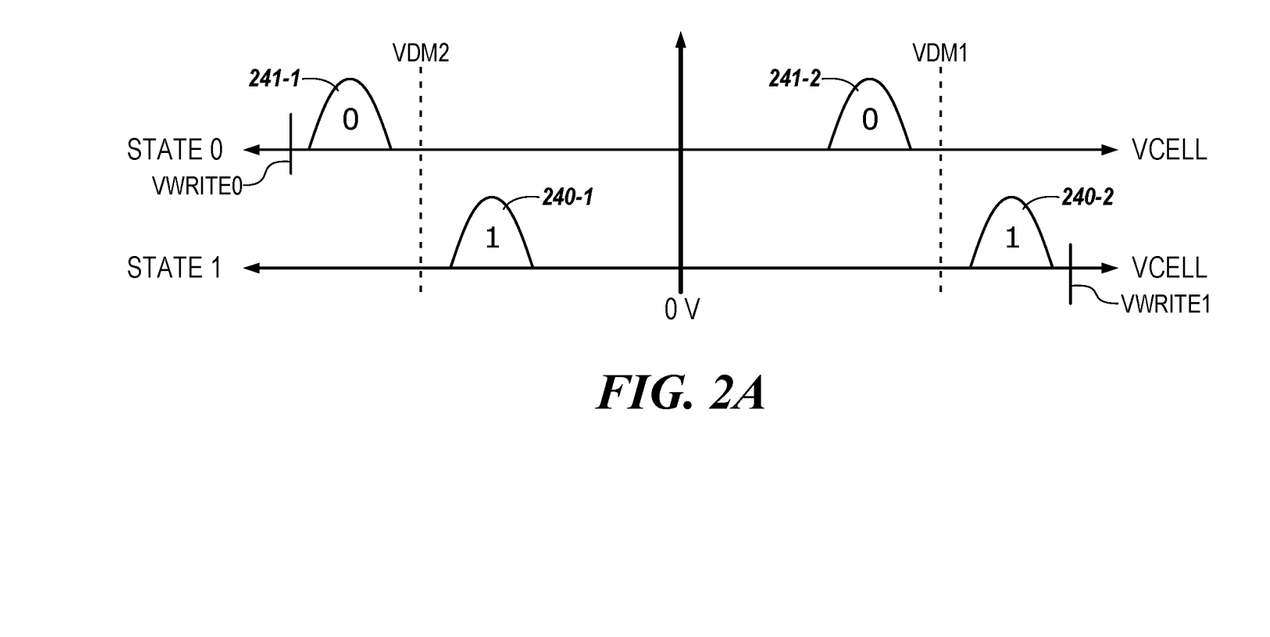
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., a first data state 0 or a second state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 240-1, 240-2, 241-1, and 241-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
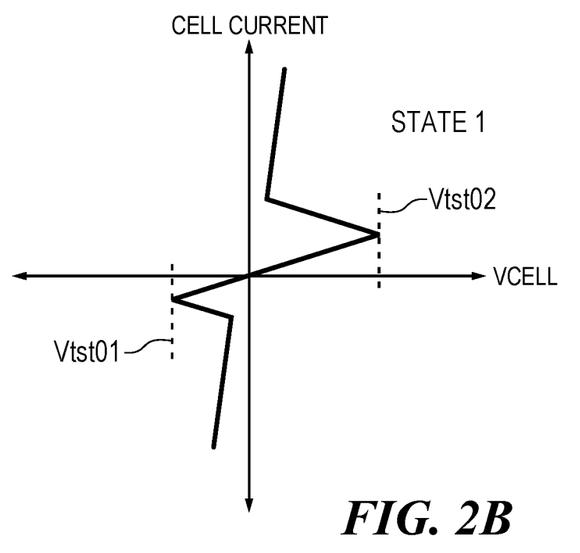
FIG. 2B is an example of a current-versus-voltage curve corresponding to a memory state of FIG. 2A, in accordance with an embodiment of the present disclosure.
Figure 2C:
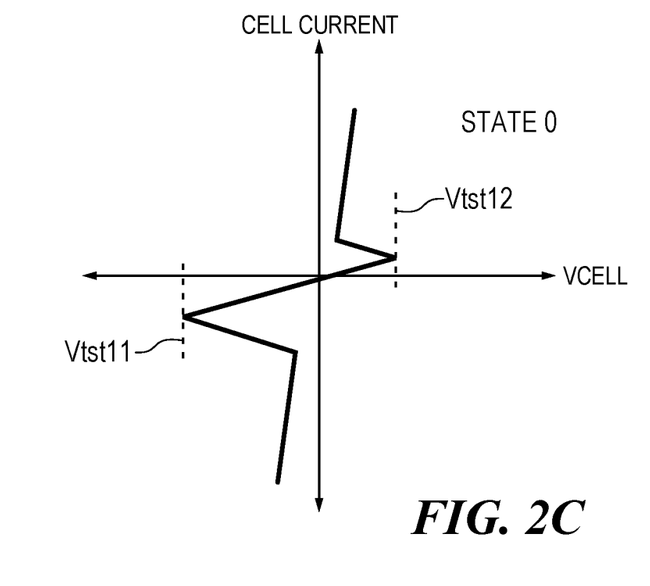
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 241-1 and 241-2) whose magnitude is greater for a negative polarity than a positive polarity, and a second data state (e.g., state 1) is associated with a second asymmetric threshold voltage distribution (e.g., threshold voltage distributions 240-1 and 240-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 241-2) from cells in state 1 (e.g., threshold voltage distribution 240-2). Similarly, VDM2 is a negative voltage used to distinguish cells in state 1 (e.g., threshold voltage distribution 240-1) from cells in state 0 (e.g., threshold voltage distribution 241-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2. One or more embodiments provide that a demarcation voltage may be utilized as a sub-threshold voltage, as discussed herein.

Embodiments are not limited to the example shown in FIG. 2A. For example, the designations of state 0 and state 1 can be interchanged (e.g., distributions 241-1 and 241-2 can be designated as state 1 and distributions 240-1 and 240-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 240-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 240-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 241-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 241-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 241-2). As such, in a number of embodiments, a snapback event can be used to write a cell to the opposite state (e.g., from state 1 to state 0 and vice versa).

Figure 3A:
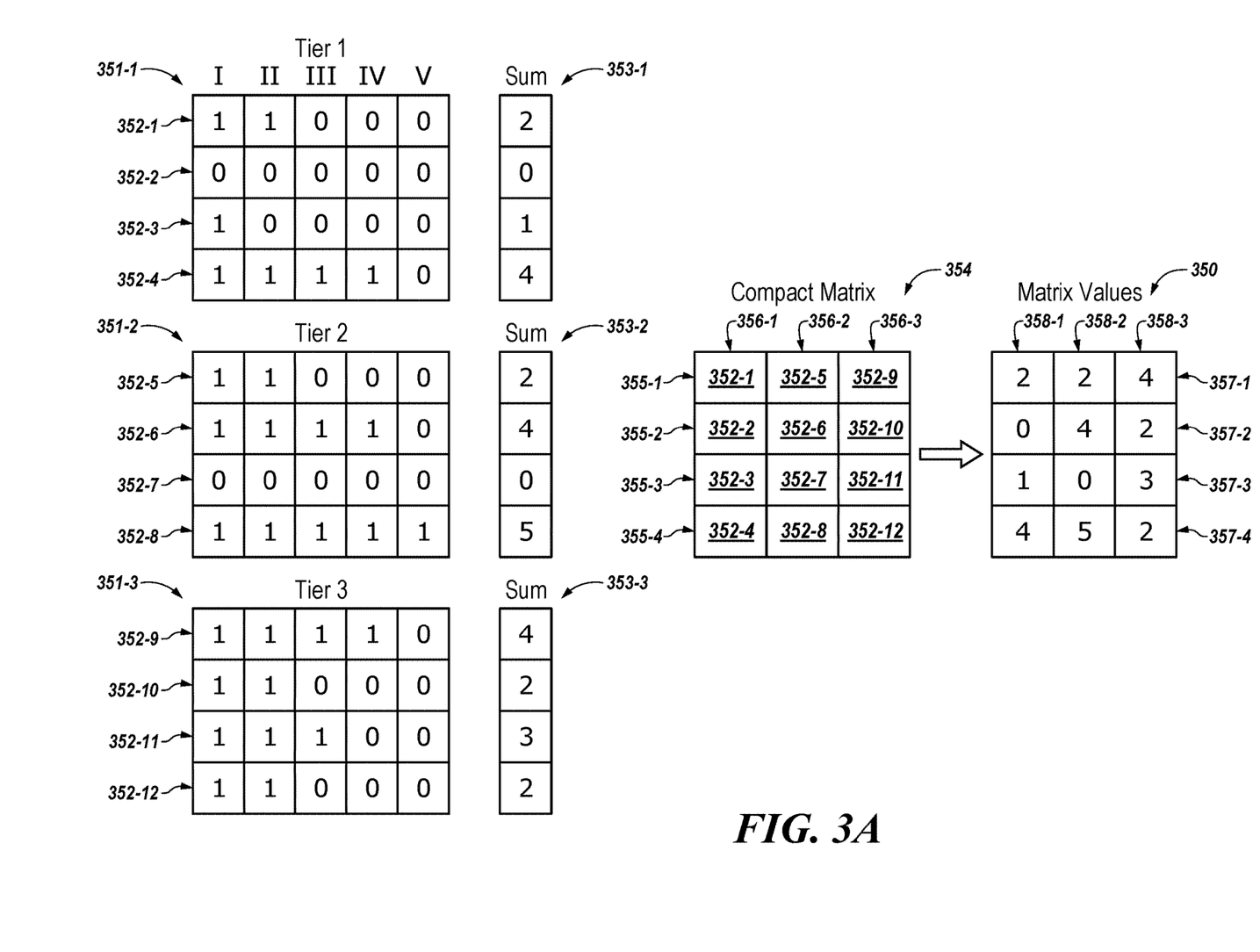
FIG. 3A illustrates a conceptual example of the formation of a matrix in accordance with one or more embodiments of the present disclosure.

FIG. 3A illustrates a conceptual example of the formation of a matrix 350 in accordance with one or more embodiments of the present disclosure. One or more embodiments provide that voltage circuitry can be configured to apply sub-threshold voltages to the memory cells of each respective level of a memory array (e.g., levels 102-A, 102-B, 102-C of array 100 as shown in FIG. 1). As mentioned, a "sub-threshold voltage" is a voltage that would not cause a switching event to occur in the cell (e.g., a voltage that is less than the threshold voltage of the cell). One or more embodiments provide that a different sub-threshold voltage can be applied to the memory cells of each different level (e.g., a first sub-threshold voltage can be applied to the cells of level 102-A, a second sub-threshold voltage can be applied to the cells of level 102-B, etc.). One or more embodiments provide that the same sub-threshold voltage can be applied to the memory cells of each different level. One or more embodiments provide that a different sub-threshold voltage can be applied to the memory cells of at least two different levels. One or more embodiments provide that the same sub-threshold voltage can be applied to the memory cells of at least two different levels.

The sub-threshold voltages can be applied via the first signal lines (e.g., access lines/word lines 110A-0, 110A-1 to 110A-N, 110B-0, 110B-1 to 110B-N, 110C-0, 110C-1 to 110C-N as shown in FIG. 1). For instance, a voltage vector (V1, V2, V3) may be applied to the levels (e.g., levels 102A, 102B, 102C as shown in FIG. 1) to bias the memory cells in the sub-threshold voltage regime.

Second signal lines (e.g., sense lines 120-0, 120-1 to 120-M as shown in FIG. 1) may be utilized to determine values corresponding to the respective cells to which the sub-threshold voltages have been applied. For instance, sense circuitry can be coupled to a plurality of sense lines (e.g., sense lines 120-0, 120-1 to 120-M), wherein the sense circuitry can be coupled to each respective sense line and be configured to sense a state for each of the number of memory cells coupled to that respective sense line responsive to the voltage circuitry applying the sub-threshold voltages to the memory cells of each respective level. For instance, the sense circuitry coupled to sense line 120-0 can sense the state for memory cells 125-1, 125-4, 125-7, 125-10, 125-13, 125-16, 125-19, 125-22, and 125-25). Circuitry (e.g., sense circuitry) can be utilized for sensing a state for each of the memory cells responsive to applying the sub-threshold voltages to the memory cells. As discussed further herein, a matrix can be formed utilizing each respective sensed state. For instance, the matrix can include values corresponding to the states for each memory cell of each respective level, as discussed further herein.

The sensed states for each of the memory cells can correspond to the conductance of that respective cell. One or more embodiments provide that, although a memory cell can have a binary conductance, a plurality of cells (e.g., coupled to a same word line) can provide analog-like definition utilizing multiple levels. For instance, the conductance a of a memory cell coupled to the $i^{th}$ digit line and $k^{th}$ word line of the array and on the $j^{th}$ level of the array can be considered as:

$$a_{ij}^k$$

and the current I to the $i^{th}$ digit line (DLi$^{th}$), is:

$$I_{ij} = \sum_{k=1}^{n} a_{ij}^k \cdot V_j$$

where $V_j$ is the sub-threshold voltage applied to the $j^{th}$ level of the array, and:

$$a_{ij} = \sum_{k=1}^{n} a_{ij}^k.$$

In the example shown in FIG. 3A, the states for memory cells from three levels (tier 1 corresponding to table 351-1, tier 2 corresponding to table 351-2, tier 3 corresponding to table 351-3) are utilized to form matrix 350. While three levels are used in the example shown in FIG. 3A, embodiments are not so limited and other numbers of levels may be utilized.

One or more embodiments provide that the sensed state for only a single (e.g., no more than one) memory cell coupled to a particular conductive pillar (e.g., a particular pillar 112 as shown in FIG. 1) of the memory is utilized to form (e.g., generate a value for) the matrix. However, embodiments are not so limited.

One or more embodiments provide that forming the matrix comprises utilizing the sensed states for each of the memory cells coupled to a particular access line to generate a value for the matrix. Tables 351-1 to 351-3 are values that represent states (e.g., sensed states) of the memory cells responsive to applying the sub-threshold voltages to those memory cells. Rows 352-1 to 352-12 each correspond to a different signal line (e.g., a different word line). For instance, rows 352-1 to 352-4 each correspond to a different respective word line of tier1 351-1, rows 352-5 to 352-8 each correspond to a different respective word line of tier2 351-2, and rows 352-9 to 352-12 each correspond to a different respective word line of tier3 351-3. In the example shown in FIG. 3A, row 352-1 includes values corresponding to the states of five respective memory cells, where a first memory cell (in column I) has a state corresponding to a value of 1, a second memory cell (in column II) has a state corresponding to a value of 1, a third memory cell (in column III) has a state corresponding to a value of 0, a fourth memory cell (in column IV) has a state corresponding to a value of 0, and a fifth memory cell (in column V) has a state corresponding to a value of 0. As an example, a value of 1 can correspond to a memory cell SET state, and a value of 0 can correspond to a memory cell RESET state; however, embodiments are not so limited. While tables 351-1 to 353-3 each illustrate the values corresponding to five memory cells (e.g., corresponding to columns I, II, III, IV, V) coupled to respective word lines, embodiments are not so limited and different numbers of memory cells coupled to respective word lines may be utilized for matrix formation. Further, one or more embodiments provide that forming the matrix includes utilizing the sensed states for the memory cells of each respective level to form different respective columns of the matrix.

One or more embodiments provide that the sensed states for the memory cells of each respective level that are coupled to a particular sense line of the memory are summed to provide a value for different respective elements of the matrix. As shown in tables 353-1 to 353-3, the values that represent the states of the memory cells responsive to the sub-threshold voltages being applied to those memory cells can be summed for matrix formation. For instance, the values of row 352-1 can be summed (1+1+0+0+0) to 2, as shown in table 353-1; similarly, the values of row 352-8 can be summed (1+1+1+1+1) to 5, as shown in table 353-2. One or more embodiments provide that the conductance of the cells can be defined as a sum over the k vector (I/V).

In the example shown in FIG. 3A, compact matrix 354 indicates memory array locations of memory cells, to which sub-threshold voltages are applied to obtain values that the represent states of those memory cells, for matrix formation. For instance, compact matrix 354 can include a number of rows 355-1, 355-2, 355-3, 355-4 and a number of columns 356-1, 356-2, 356-3. While compact matrix 354 includes four rows and three columns, embodiments are not so limited and other numbers of rows and/or columns may be utilized.

Compact matrix 354 includes entries determined from values that represent states of the memory cells responsive to the sub-threshold voltages being applied to those memory cells, wherein the memory cell's are coupled to particular, respective word lines and the memory cells are associated with particular, respective levels of the memory array. For instance, compact matrix 354 row 355-1, column 356-1 can correspond to a number of memory cells coupled to a first word line of tier1 351-1, compact matrix 354 row 355-2, column 356-1 can correspond a number of memory cells coupled to a second word line of tier1 351-1, and compact matrix 354 row 355-3, column 356-2 can correspond a number of memory cells coupled to a first word line of tier2 351-2. One or more embodiments provide that each row of compact matrix 354 can correspond to values determined from memory cells that are coupled to a particular, respective conductive pillar (e.g., pillars 112-1, 112-2, 112-3, 112-4, 112-5, 112-6, 112-7, 112-8, 112-9 shown in FIG. 1); however, embodiments are not so limited. One or more embodiments provide that each column of compact matrix 354 can correspond to values determined from memory cells that are associated with a particular, respective level (e.g., levels 102A, 102B, 102C shown in FIG. 1); however, embodiments are not so limited. As an example, one or more embodiments provide that a first group of memory cells of a first level is coupled to a first access (e.g., word) line and a first sense line, and a second group of memory cells of the first level is coupled to a second access line and a second sense line; and that a third group of memory cells of a second level is coupled to a third access line and the first sense line, and a fourth group of memory cells of the second level is coupled to a fourth access line and the second sense line.

Matrix 350 can include a number of rows 357-1, 357-2, 357-3, 357-4 and a number of columns 358-1, 358-2, 358-3. While matrix 350 includes four rows and three columns, embodiments are not so limited and other numbers of rows and/or columns may be utilized. For instance, one or more embodiments provides that the matrix comprises three or more rows and three or more columns. As shown in FIG. 3A, the values that represent the states of the memory cells responsive to the sub-threshold voltages being applied to those memory cells can be summed (e.g., as shown in tables 353-1, 353-2, 353-3) to form matrix 350 (e.g., to provide a value for the different respective elements of the matrix). For instance, the values of table 353-1 form column 358-1 of matrix 350, the values of table 353-2 form column 358-2 of matrix 350, and the values of table 353-3 form column 358-3 of matrix 350.

Figure 3B:
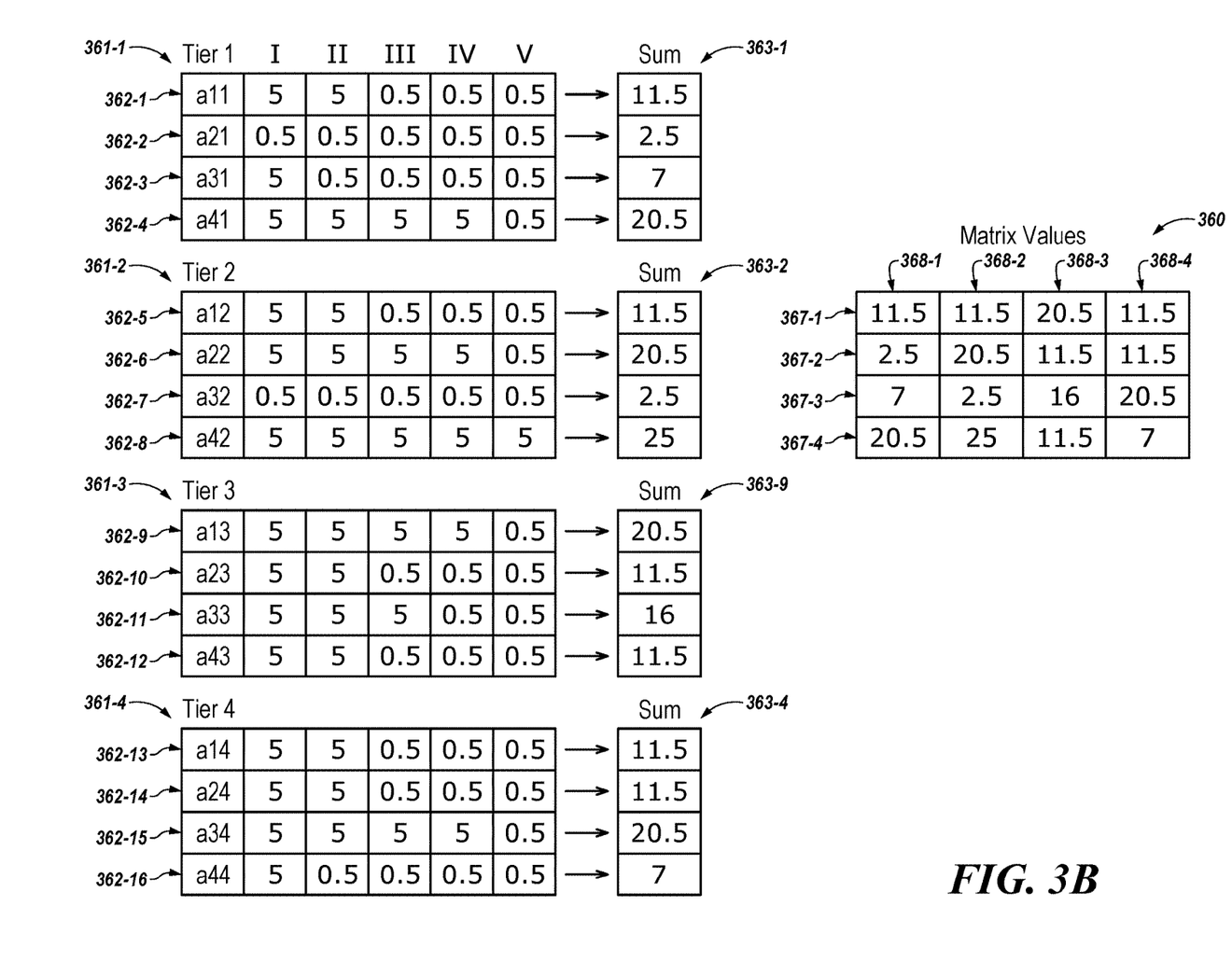
FIG. 3B illustrates a conceptual example of the formation of a matrix in accordance with one or more embodiments of the present disclosure.

FIG. 3B illustrates a conceptual example of the formation of a matrix 360 in accordance with one or more embodiments of the present disclosure. As mentioned, voltage circuitry can be configured to apply sub-threshold voltages to the memory cells of each respective level of a memory array (e.g., levels 102A, 102B, 102C of array 100 as shown in FIG. 1). One or more embodiments provide that the sub-threshold voltages can be applied for different times. For instance, the same sub-threshold voltage can be applied to the memory cells of each respective level, where the sub-threshold voltage is applied for different times (e.g., different pulse durations) to the memory cells of each respective level.

Further, as mentioned, sense circuitry can be configured to sense the state for each memory cell coupled to a respective sense line of the memory array responsive to the voltage circuitry applying the sub-threshold voltages. In the example shown in FIG. 3B, the states for memory cells from four levels (tier 1 corresponding to table 361-1, tier 2 corresponding to table 361-2, tier 3 corresponding to table 361-3, tier 4 corresponding to table 361-4) are utilized to form matrix 360. While four levels are shown in FIG. 3B, embodiments are not so limited and other numbers of levels may be utilized.

One or more embodiments provide that forming the matrix comprises utilizing the sensed states for each of the memory cells coupled to a particular access line to generate a value for the matrix. Tables 361-1 to 361-4 are values that represent states of the memory cells responsive to applying the sub-threshold voltages to those memory cells (e.g., a same sub-threshold voltage for different pulse durations for different levels). Rows 362-1 to 362-16 each correspond to a different signal line (e.g., a different word line). For instance, rows 362-1 to 362-4 each correspond to a different respective word line of tier1 361-1, rows 362-5 to 362-8 each correspond to a different respective word line of tier2 361-2, rows 362-9 to 362-12 each correspond to a different respective word line of tier3 361-3, and rows 362-13 to 362-16 each correspond to a different respective word line of tier4 361-4. In the example shown in FIG. 3B, row 362-1 includes values corresponding to the states (e.g., detected currents, where a SET state provides approximately 5 nA and a RESET state provides approximately 0.5 nA) of five respective memory cells, where a first memory cell (in column I) has a state corresponding to a value (e.g., current value) of 5, a second memory cell (in column II) has a state corresponding to a value of 5, a third memory cell (in column III) has a state corresponding to a value of 0.5, a fourth memory cell (in column IV) has a state corresponding to a value of 0.5, and a fifth memory cell (in column V) has a state corresponding to a value of 0.5. As mentioned, as an example, a value of 5 can correspond to a memory cell SET state, and a value of 0.5 can correspond to a memory cell RESET state; however, embodiments are not so limited. While tables 361-1 to 363-4 each illustrate the values corresponding to five memory cells (e.g., corresponding to columns I, II, III, IV, V) coupled to respective first signal lines, embodiments are not so limited and different numbers of memory cells coupled to respective first signal lines may be utilized for matrix formation.

As shown in tables 363-1 to 363-4, the values that represent the states of the memory cells responsive to the sub-threshold voltages (e.g., a same sub-threshold voltage for different pulse durations for different levels) being applied to those memory cells can be summed for matrix formation. For instance, the values of row 362-1 can be summed (5+5+0.5+0.5+0.5) to 11.5, as shown in table 363-1; similarly, the values of row 362-8 can be summed (5+5+5+5+5) to 25, as shown in table 363-2.

One or more embodiments provide that an input voltage vector can be encoded into pulse durations (e.g., instead of voltage magnitude). As such, the output voltage across each respective digit line i ($V_{out,i}$) can be determined from a sum of the current integrated over a duration of each pulse width onto a capacitance C (e.g., the capacitance of the capacitors of circuitry 121-0, 121-1, 121-M). For example, for a constant current ($I_{ij}$), the output voltage can be given by:

$$V_{out,i} = I_{ij} \cdot \Delta t_i / C.$$

where $t_i$ is the duration of the voltage pulse. As such, each current contribution can be integrated for a given time (e.g., the duration of the pulse) on the output capacitance to provide the output voltage (e.g., as illustrated in tables 361-1 to 361-4.).

Matrix 360 can include a number of rows 367-1, 367-2, 367-3, 367-4 and a number of columns 368-1, 368-2, 368-3, 368-4. While matrix 360 includes four rows and four columns, embodiments are not so limited and other numbers of rows and/or columns may be utilized. As shown in FIG. 3B, the values that represent the states of the memory cells responsive to the sub-threshold voltages being applied to those memory cells can be summed (e.g., as shown in tables 363-1, 363-2, 363-3, 363-4) to form matrix 360 (e.g., to provide a value for the different respective elements of the matrix). For example, the values of table 363-1 form column 368-1 of matrix 360, the values of table 363-2 form column 368-2 of matrix 360, etc.

Embodiments provide that matrix 350 and/or matrix 360 can be utilized to perform computational operations (e.g., to perform computational operations on data stored in the memory). Because the circuitry (e.g., circuitry 121-0 to 121-M shown in FIG. 1) that is utilized to form the matrix and perform the computational operations is on a same chip of the array (e.g. the circuitry is located under the array), embodiments provide that performing the computational operations comprises not transferring the data to external processing circuitry (e.g., an external controller, such as controller 407 described in connection with FIG. 4). Because the circuitry and the memory cells utilized to form the matrix and/or perform the computational operations on the data stored in the memory using the matrix are physically nearer one another (e.g., integrated on the same chip), power consumption and/or system resource utilization are improved.

The computational operations can include matrix-vector operations. For example, the computational operations can include matrix-vector multiplication operations, among others.

Figure 4:
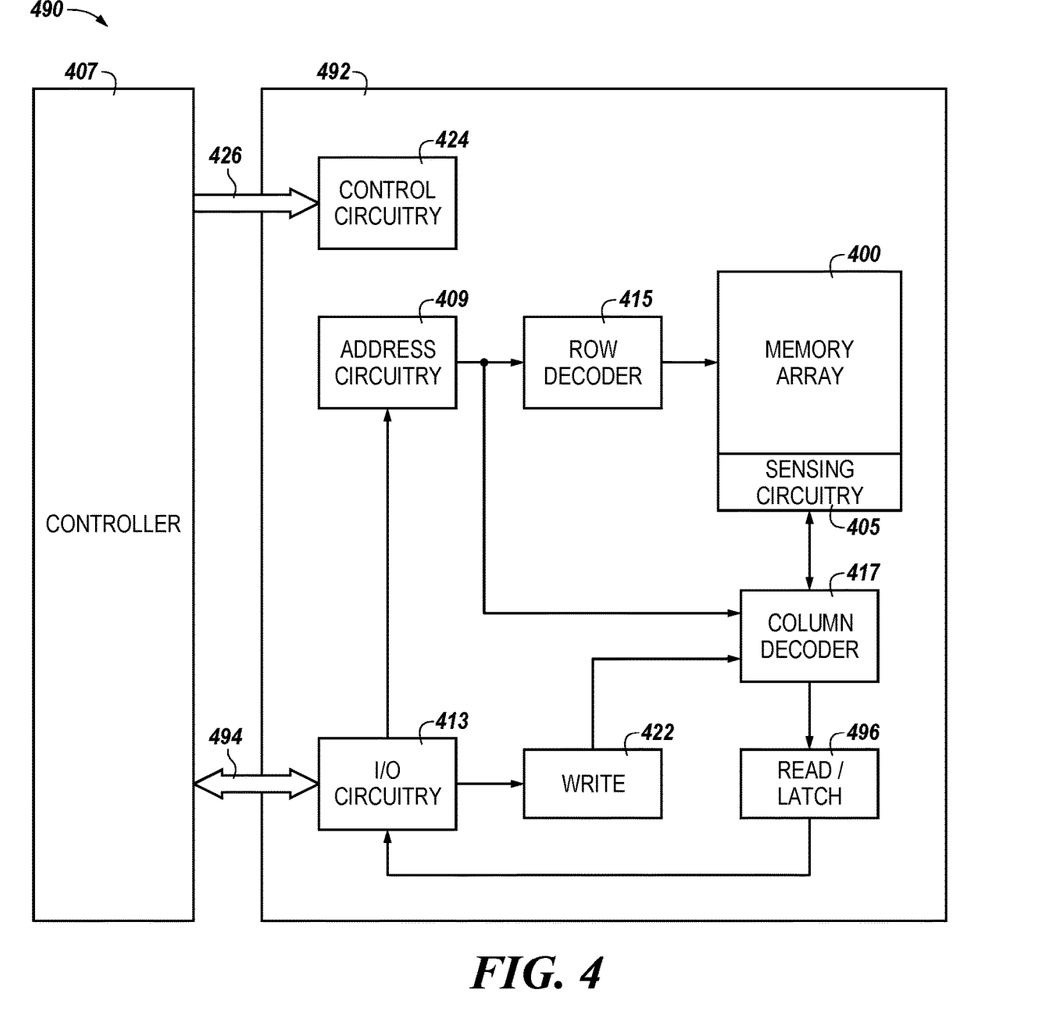
FIG. 4 is a block diagram illustration of an example apparatus, in accordance with an embodiment of the present disclosure.

FIG. 4 is a block diagram illustration of an example apparatus, such as an electronic memory system 490, in accordance with an embodiment of the present disclosure. Memory system 490 may include an apparatus, such as a memory device 492 and a controller 407, such as a memory controller (e.g., a host controller). Controller 407 might include a processor, for example. Controller 407 might be coupled to a host, for example, and may receive command signals (or commands), address signals (or addresses), and data signals (or data) from the host and may output data to the host.

Memory device 492 includes a memory array 400 of memory cells. For example, memory array 400 may include one or more of the memory arrays, such as a vertical pillar array, of memory cells disclosed herein. Although one memory array 400 is illustrated in FIG. 4 for simplicity and so as not to obscure embodiments of the present disclosure, memory device 492 can include a number of memory arrays analogous to array 400.

Memory device 492 may include address circuitry 409 to latch address signals provided over I/O connections 494 through I/O circuitry 413. Address signals may be received and decoded by a row decoder 415 and a column decoder 417 to access the memory array 400. For example, row decoder 415 and/or column decoder 417 may include drivers.

Memory device 492 may sense (e.g., read) data in memory array 400 by sensing voltage and/or current changes in the memory array columns using sense/buffer circuitry that in some examples may be read/latch circuitry 496. Read/latch circuitry 496 may read and latch data from the memory array 400. Sensing circuitry 405 may include a number of sense amplifiers coupled to memory cells of memory array 400, which may operate in combination with the read/latch circuitry 496 to sense (e.g., read) memory states from targeted memory cells. I/O circuitry 413 may be included for bi-directional data communication over the I/O connections 494 with controller 407. Write circuitry 422 may be included to write data to memory array 400.

Control circuitry 424 may decode signals provided by control connections 426 from controller 407. These signals may include chip signals, write enable signals, and address latch signals that are used to control the operations on memory array 400, including data read and data write operations.

Control circuitry 424 may be included in controller 407, for example. Controller 407 may include other circuitry, firmware, software, or the like, whether alone or in combination. Controller 407 may be an external controller (e.g., in a separate die from the memory array 400, whether wholly or in part) or an internal controller (e.g., included in a same die as the memory array 400). For example, an internal controller might be a state machine or a memory sequencer.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of levels, wherein each of the plurality of levels includes a plurality of memory cells:
voltage circuitry configured to apply sub-threshold voltages to the memory cells of each respective level:
a plurality of sense lines, wherein each of the plurality of sense lines is coupled to a number of the memory cells of each respective level:
sense circuitry coupled to the plurality of sense lines, wherein the sense circuitry coupled to each respective sense line is configured to sense a state for each of the number of memory cells coupled to that respective sense line responsive to the voltage circuitry applying the sub-threshold voltages to the memory cells of each respective level; and
processing circuitry configured to:
utilize the states for each of the memory cells to form a matrix; and
perform computational operations on data stored in the memory using the matrix.

2. The apparatus of claim 1, wherein the voltage circuitry is configured to apply a different sub-threshold voltage to the memory cells of each respective level.

3. The apparatus of claim 1, wherein the voltage circuitry is configured to apply a same sub-threshold voltage to the memory cells of each respective level.

4. The apparatus of claim 3, wherein the voltage circuitry is configured to apply the same sub-threshold voltage to the memory cells of each respective level for different times.

5. The apparatus of claim 1, wherein each of the plurality of memory cells is a self-selecting memory cell in which a single material serves as a select element and a storage element, wherein the single material is a chalcogenide material.

6. The apparatus of claim 1, wherein the memory and the processing circuitry are on a same chip of the apparatus.

7. A method of operating memory, comprising:
applying sub-threshold voltages to memory cells of a memory, wherein:
the memory includes a plurality of levels; and
the sub-threshold voltages are applied to the memory cells of each respective level;
sensing a state for each of the memory cells responsive to applying the sub-threshold voltages to the memory cells;
forming a matrix utilizing each respective sensed state; and
performing computational operations on data stored in the memory using the matrix.

8. The method of claim 7, wherein the method includes performing the computational operations without transferring the data to external processing circuitry.

9. The method of claim 7, wherein forming the matrix comprises utilizing the sensed states for each of the memory cells coupled to a particular access line of the memory to generate a value for the matrix.

10. The method of claim 7, wherein forming the matrix comprises utilizing the sensed state for a single memory cell of a particular conductive pillar of the memory to generate a value for the matrix.

11. The method of claim 7, wherein forming the matrix comprises utilizing the sensed states for the memory cells of each respective level to form different respective columns of the matrix.

12. The method of claim 11, wherein the sensed states for the memory cells of each respective level that are coupled to a particular sense line of the memory are summed to provide a value for different respective elements of the matrix.

13. An apparatus, comprising:
an array of memory cells comprising a plurality of levels, wherein each of the plurality of levels includes a plurality of memory cells:
a plurality of sense lines, wherein each of the plurality of sense lines is coupled to a number of the memory cells of each respective level; and circuitry coupled to the array and configured to:
apply sub-threshold voltages to the memory cells of each respective level;
sense a state for each of the number of memory cells coupled to each respective sense line responsive to the sub-threshold voltages being applied to the memory cells of each respective level;
form a matrix with values corresponding to the states for each of the number of memory cells of each respective level; and
perform computational operations on data stored in the array using the matrix.

14. The apparatus of claim 13, wherein the circuitry is located under the array.

15. The apparatus of claim 13, wherein the computational operations include matrix-vector operations.

16. The apparatus of claim 15, wherein the matrix-vector operations include matrix-vector multiplication operations.

17. The apparatus of claim 13, wherein a first group of memory cells of a first level of the plurality of levels is coupled to a first access line and a first sense line of the plurality of sense lines, and a second group of memory cells of the first level of the plurality of levels is coupled to a second access line and a second sense line of the plurality of sense lines.

18. The apparatus of claim 17, wherein a third group of memory cells of a second level of the plurality of levels is coupled to a third access line and the first sense line, and a fourth group of memory cells of the second level of the plurality of levels is coupled to a fourth access line and the second sense line.

19. The apparatus of claim 13, wherein the states for each of the number of memory cells corresponds to a conductance of that respective memory cell.

20. The apparatus of claim 13, wherein the matrix comprises three or more rows and three or more columns.

* * * * *